(12) United States Patent
Lee et al.

(10) Patent No.: US 7,161,823 B2
(45) Date of Patent: Jan. 9, 2007

(54) SEMICONDUCTOR MEMORY DEVICE AND METHOD OF ARRANGING SIGNAL AND POWER LINES THEREOF

(75) Inventors: Jae-Young Lee, Gyeonggi-do (KR); Joon-Hyuk Kwon, Gyeonggi-do (KR); Chi-Wook Kim, Gyeonggi-do (KR); Sung-Hoon Kim, Gyeonggi-do (KR); Youn-Sik Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 54 days.

(21) Appl. No.: 11/134,855

(22) Filed: May 19, 2005

(65) Prior Publication Data

US 2005/0286285 A1 Dec. 29, 2005

(30) Foreign Application Priority Data

Jun. 3, 2004 (KR) ...................... 10-2004-0040542
Sep. 17, 2004 (KR) ...................... 10-2004-0074730

(51) Int. Cl.
*G11C 5/06* (2006.01)

(52) U.S. Cl. ...................... 365/63; 365/51; 365/230.03

(58) Field of Classification Search .................. 365/63, 365/51, 227, 230.03, 233, 189.08
See application file for complete search history.

(56) References Cited

U.S. PATENT DOCUMENTS

| | | | |
|---|---|---|---|
| 5,148,263 A | 9/1992 | Hamai | |
| 5,604,697 A | 2/1997 | Takahashi et al. | |
| 5,831,924 A * | 11/1998 | Nitta et al. | ............ 365/230.03 |
| 5,930,166 A | 7/1999 | Jeon | |
| 5,936,875 A * | 8/1999 | Kim et al. | ..................... 365/51 |
| 6,359,803 B1* | 3/2002 | Tanaka | ........................ 365/63 |
| 6,418,067 B1* | 7/2002 | Watanabe et al. | ........... 365/200 |
| 6,664,634 B1 | 12/2003 | Thompson et al. | |
| 6,717,833 B1 | 4/2004 | Kitsukawa et al. | |
| 2005/0152203 A1* | 7/2005 | Choi et al. | ............. 365/230.03 |
| 2006/0055045 A1* | 3/2006 | Park et al. | ................... 257/758 |
| 2006/0056218 A1* | 3/2006 | Park et al. | ..................... 365/63 |
| 2006/0060986 A1* | 3/2006 | Kim et al. | .................. 257/786 |

FOREIGN PATENT DOCUMENTS

| | | |
|---|---|---|
| KR | 1998-041939 | 8/1998 |
| KR | 2002-0021201 | 3/2002 |

* cited by examiner

*Primary Examiner*—Richard Elms
*Assistant Examiner*—Hien N Nguyen
(74) *Attorney, Agent, or Firm*—Marger Johnson & McCollom, P.C.

(57) ABSTRACT

Method and apparatus for use, e.g., with Synchronous Dynamic Random Access Memory (SDRAM) circuits are disclosed. In one described embodiment, three metal layers are deposited and patterned in turn overlying a memory array portion of an SDRAM. Relatively wide power conductors are routed on a third metal layer, allowing power conductors to be reduced in size, or in some cases eliminated, on first and second metal layers. The relatively wide power conductors thus can provide a more stable power supply to the memory array, and also free some space on first and/or second metal for routing of additional and/or more widely spaced signal conductors. Other embodiments are described and claimed.

47 Claims, 16 Drawing Sheets

SEMICONDUCTOR MEMORY DEVICE AND METHOD OF ARRANGING SIGNAL AND POWER LINES THEREOF

BACKGROUND OF THE INVENTION

RELATED APPLICATIONS

This application claims the benefit of priority to Korean Patent Applications P2004-40542, filed Jun. 3, 2004, and P2004-74730, filed Sep. 17, 2004, the disclosures of which are incorporated herein by reference.

1. Field of the Invention

The present invention relates to dynamic random access memory (DRAM) semiconductor devices, and more particularly to methods and apparatus for routing power and signal traces in patterned metal layers overlying such devices.

2. Description of the Related Art

DRAM devices include a memory array, circuitry to access the memory array, and peripheral circuitry to control DRAM operation and communicate with external devices. Typical memory arrays are formed of a repeating pattern of sub memory cell arrays interspersed with a portion of the circuitry used to access the memory array. The remainder of the access circuitry is generally located in a row decoder and a column decoder located at the edges of the memory array.

FIG. 1 shows a typical memory arrangement 100, comprising a memory array 10, a column decoder 20, and a row decoder 30. The memory array 10 is arranged somewhat like a checkerboard, with sub memory cell arrays (SMCAs) separated vertically by sub word line drivers (SWDs) and separated horizontally by sense amplifiers (SAs) for the memory cells. Each of the sub memory cell arrays comprises a plurality of memory cells (MC), each of which is composed of an access transistor enabled by a sub word line (SWL) and a capacitor to store data. The SAs are separated vertically by conjunction regions (CJs) that contain control signal generation circuitry for the SAs.

The column decoder 20 generates signals on column select lines (CSLs) to select one or more columns of the array for reading or writing according to a supplied column address (CA).

The row decoder 30 responds to a supplied row address to activate memory cells in a row of the array, by selecting one of a plurality of main word line (NWE) and word line select (PX) signals.

Further aspects of FIG. 1 will be explained in conjunction with FIG. 2, which shows further detail of a portion of array 10. Two memory cells MC1 and MC2 are shown respectively in SMCA1 and SMCA2. Each memory cell comprises a capacitor C connected between a cell plate voltage (Vp) and the source of an access transistor N. Generally, Vp is half of the power supply voltage. The gate of each access transistor (N) is controlled by a corresponding sub word line (SWL), with SWL1 controlling the MC1 access transistor and SWL2 controlling the MC2 access transistor.

The drain of each access transistor is connected to a corresponding bit line (BL), e.g., BL1 for MC1 and BL2 for MC2. Each bit line also connects to other memory cells (not shown) in the respective SMCAs, with access transistors (not shown) connected to other SWLs. A sense amplifier region SA1 resides between SMCA1 and SMCA2. Referring to SMCA1, BL1 and BL1B connect to a precharge circuit PRE1 in SA1, and connect to a pair of sensing bit lines SBL and SBLB through a bit isolation gate ISO1. As to SMCA2, BL2 and BL2B connect to a precharge circuit PRE2 in SA1, and connect to the pair of sensing bit lines SBL and SBLB through a bit isolation gate ISO2. A bit line sense amplifier BLSA and a data input/output gate IOG also connect to sensing bit lines SBL and SBLB.

The bit line sense amplifier amplifies the voltage difference between BL1 and BL1B of the MC1 memory cell, for instance, in the following sequence, where the memory cell represents one of two logic states (multi-state memory cells also exist and typically use more complicated sense amplifier circuitry). Isolation gate ISO1 connects BL1 to SBL and BL1B to SBLB. Precharge circuit PRE1 charges BL1 and BL1B to a voltage midway between the voltage of a discharged capacitor C (representing, for example, logic 0) and the voltage of a charged capacitor C (representing in the same example logic 1). SWL1 is energized to couple the MC1 memory cell capacitor to BL1. When the cell capacitor was discharged, charge sharing causes the voltage on BL1 to decrease relative to BL1B. When the cell capacitor was charged, charge sharing causes the voltage on BL1 to increase relative to BL1B. After charge sharing is completed, the isolation gate ISO1 is enabled so that a slight voltage difference between the bit lines BL1/BL1B is transferred to the sensing bit lines SBL1/SBL1B. In either case, sense amplifier BLSA is activated during a predetermined period to sense and amplify the slight voltage difference between the bit lines BL1/BL1B.

Input/output gate IOG, when activated, couples SBL and SBLB to a pair of local input/output lines LIO and LIOB, which also connect to other IO gates in other SA regions (not shown) above and below SA1. Herein, the input/output gate IOG is activated responsive to column select line CSL (not shown). A local global input/output gate LGIOG serves to selectively couple LIO and LIOB to a pair of global input/output lines GIO and GIOB when LIO and LIOB are active. Thus the sensed memory cell state is coupled to a peripheral input/output circuit.

From FIGS. 1 and 2, it can be appreciated that a large number of conductors are routed over memory array 10. NWE lines route vertically across the array over the sub memory cell arrays, and PX, LIO, and LIOB lines route vertically across the array over the conjunction regions and sense amplifier regions. CSL, GIO, and GIOB lines route horizontally across the array over the sub memory cell arrays. Not shown are power conductors, which must also be routed over the array to provide power for the circuitry in the SA, CJ, and SWD regions.

FIG. 3 shows a region of memory array 10, with underlying circuit details omitted and overlying metal traces illustrated. On a first metal layer, LIO, PX, and NWE traces are spaced with first power lines P1 that supply power at different voltage levels needed by the array circuitry. Some of the first power lines P1 may comprise ground potential voltage lines (VSS) and power supply lines (VCC). Other lines of the first power lines PI may comprise a reference voltage line (Vref), a negative power line (VBB), a boosting voltage line (VPP), etc. On a second metal layer, CSL and GIO traces are spaced with second power lines P2 that supply power at the different voltage levels. Some of the second power lines P2 may also comprise ground potential voltage lines (VSS) and power supply lines (VCC). Other lines of the second power lines P2 may comprise a reference voltage line (Vref), a negative power line (VBB), a boosting voltage line (VPP), etc. Where a P2 trace overlies a P1 trace of the same voltage level, the two traces are connected to each other to create a grid. The P2 traces connect to power supplies located outside of the memory array area of the DRAM device.

FIG. 4 shows a simplified block diagram of the row decoder 30 of FIG. 1. Row decoder 30 comprises a row address decoder area 30-1 and a row address predecoder area 30-2. Within row address decoder area 30-1, each of the illustrated first decoder areas RD1 generates a word line select signal PX and each of the illustrated second decoder areas RD2 generates a main word line signal NWE responsive to row addresses RA and pre-decoding row addresses DRA, which are generated in turn by row address predecoder 30-2.

FIG. 5 illustrates a portion of row decoder 30 with the underlying circuit details omitted and overlying metal traces illustrated. Overlying a first decoder area RD1 on a first metal layer, signal lines S1 (e.g., PX lines) are flanked by first power lines PVINT1 and PVSS1. Overlying a second decoder area RD2 on the first metal layer, signal lines S1 (e.g., NWE lines) are flanked by additional first power lines PVINT1 and PVSS1.

A second metal layer contains signal lines S2 (e.g., RA and DRA lines) and second power lines PVINT2 and PVSS2. PVINT2 connects to PVINT1 where the two overlap, and PVSS2 connects to PVSS1 where the two overlap. The PVINT2 and PVSS2 traces connect to power supplies located outside of the memory array area of the DRAM device. Under this condition, the power lines cannot be designed with wider lines without increasing the chip area.

SUMMARY OF THE INVENTION

As DRAM devices scale to smaller cell dimensions and/or increase the number of cells in a memory array, more signal lines are routed over the memory array and row decoder per unit area in essentially the same area that previously served a smaller number of signal lines. The width of the power lines is therefore decreased proportionally to accommodate the denser array. Decreasing power line width is undesirable, however, as decreased power line width results in greater resistance to current flow, greater voltage drop and power consumption, and reduced power supply stability as current demands fluctuate. The various signal and power lines are also packed closer together as the device scales to smaller dimensions, resulting in an undesirable crosstalk between adjacent lines.

The embodiments described herein adopt a triple-metal-layer DRAM design that improves signal and power line routing considerably as opposed to a dual-metal-layer design. Although others have proposed various schemes to route signals over a memory array using three metal layers, it is believed that the present design addresses the problem with particular attention to the power supply issue, and thus produces a group of novel metal layer arrangements that scale well to smaller cell sizes.

DETAILED DESCRIPTION OF THE EMBODIMENTS

The following embodiments use three metal layers over a memory array, row decoder, and/or column decoder. Wider power lines are generally possible with these embodiments, improving power distribution and stability. Various advantages of the embodiments will become apparent from the description of the figures presented below.

Figure 1:
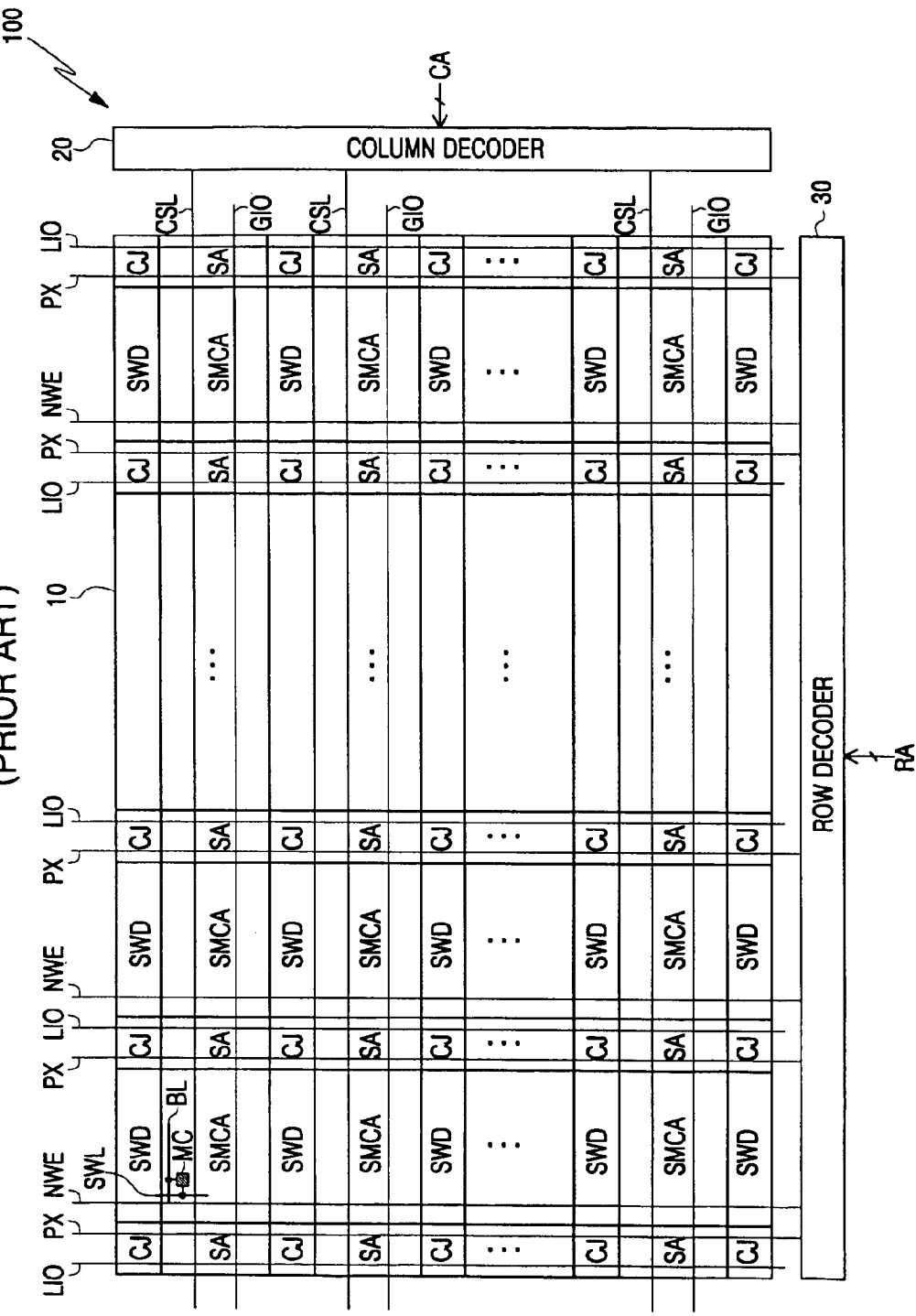
FIG. 1 illustrates a general prior art memory array and row/column decoder arrangement for a DRAM memory device.
Figure 2:
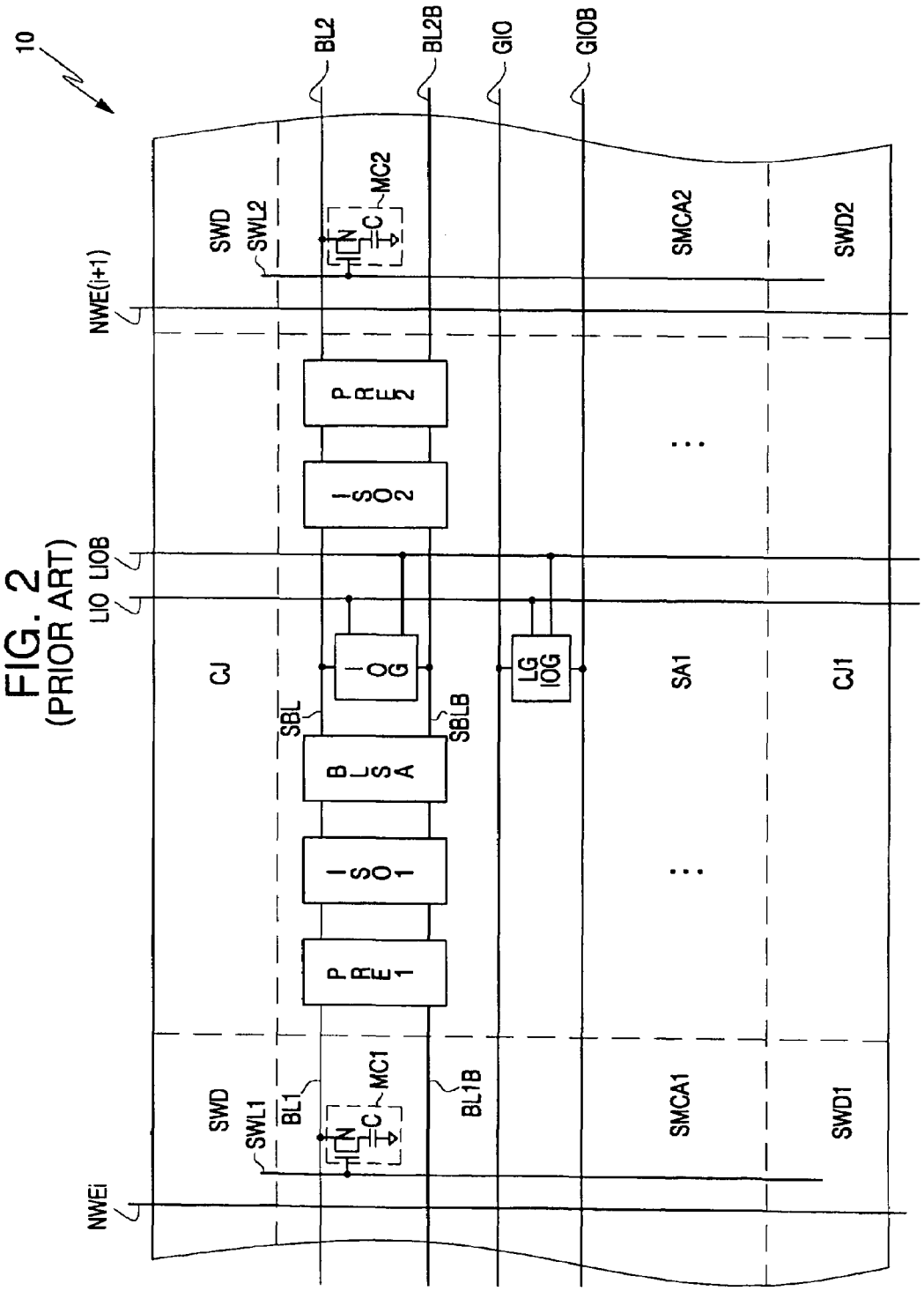
FIG. 2 illustrates an enlarged view of a portion of the FIG. 1 memory array, showing additional circuit and signal line details.
Figure 3:
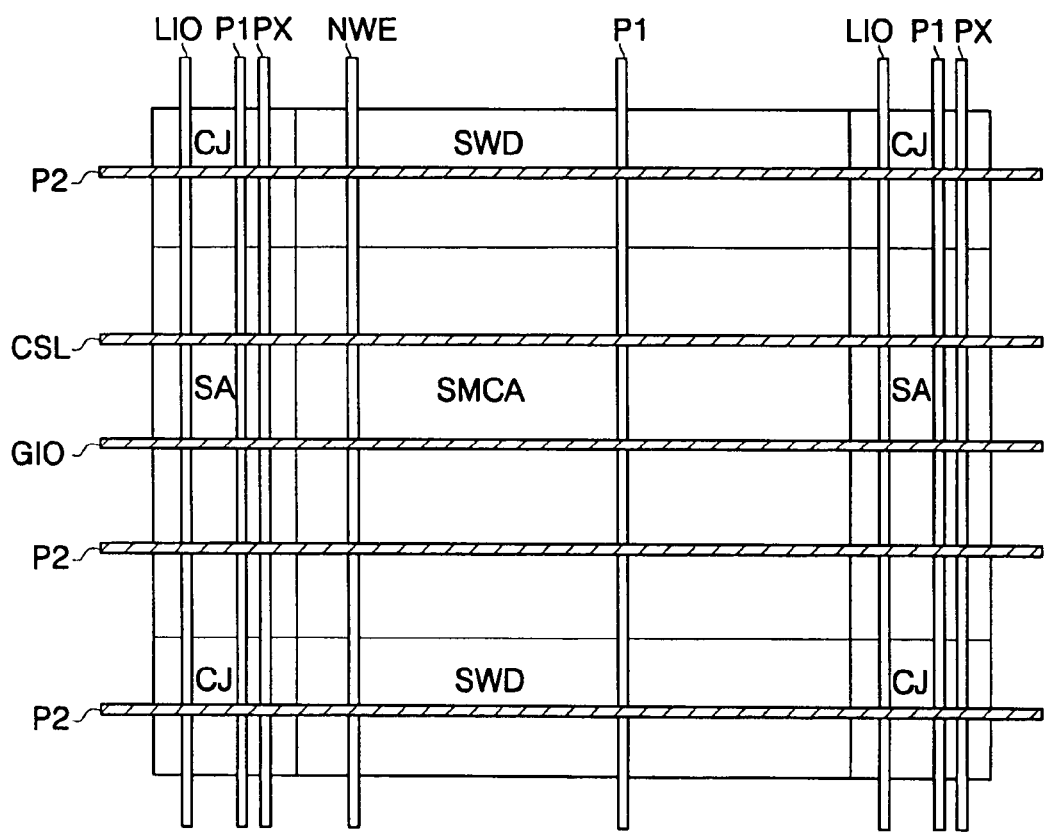
FIG. 3 also illustrates an enlarged view of a portion of the FIG. 1 memory array, this time with particular attention to the signal and power trace routing layout for the two metal layers overlying the memory array.
Figure 4:
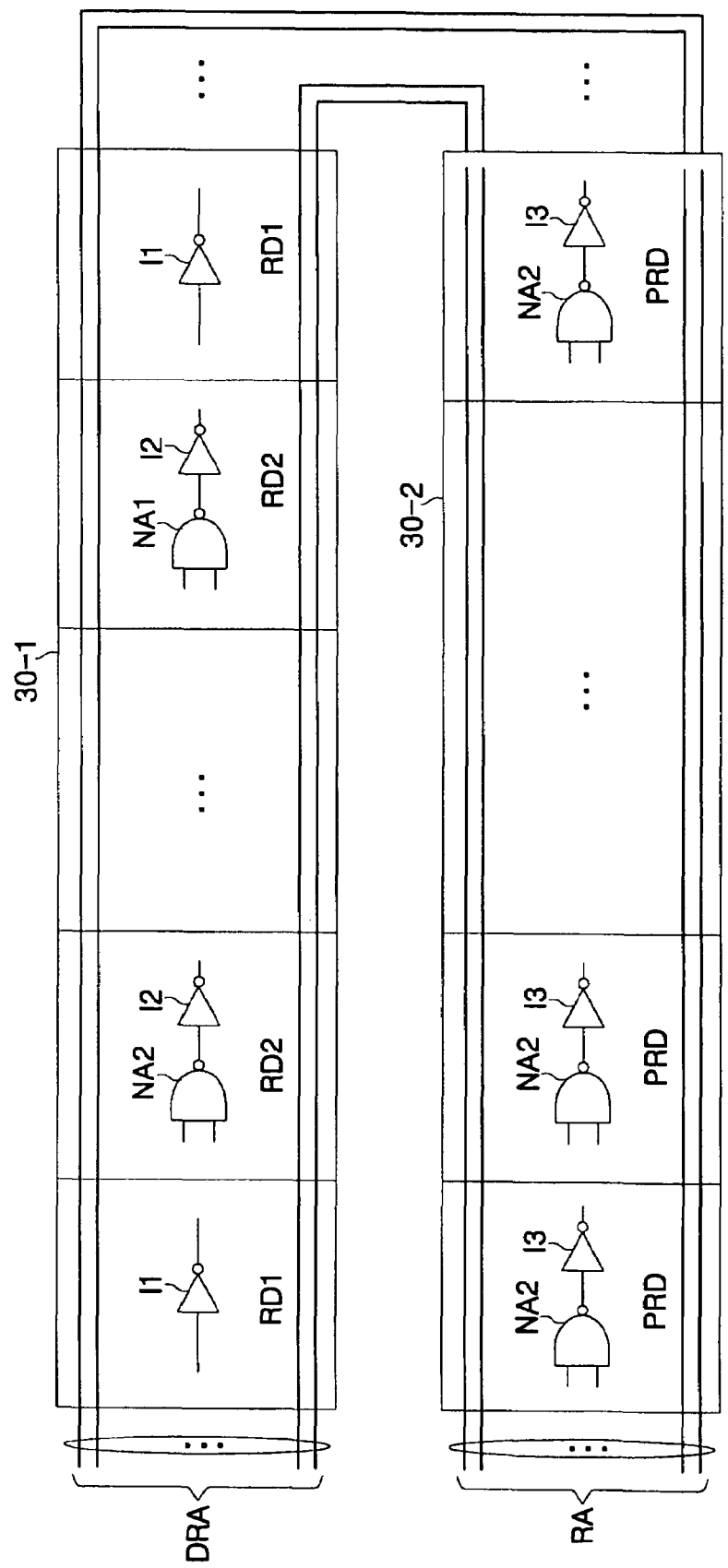
FIG. 4 illustrates an enlarged view of a portion of the FIG. 1 row decoder, showing additional circuit and signal line details.
Figure 5:
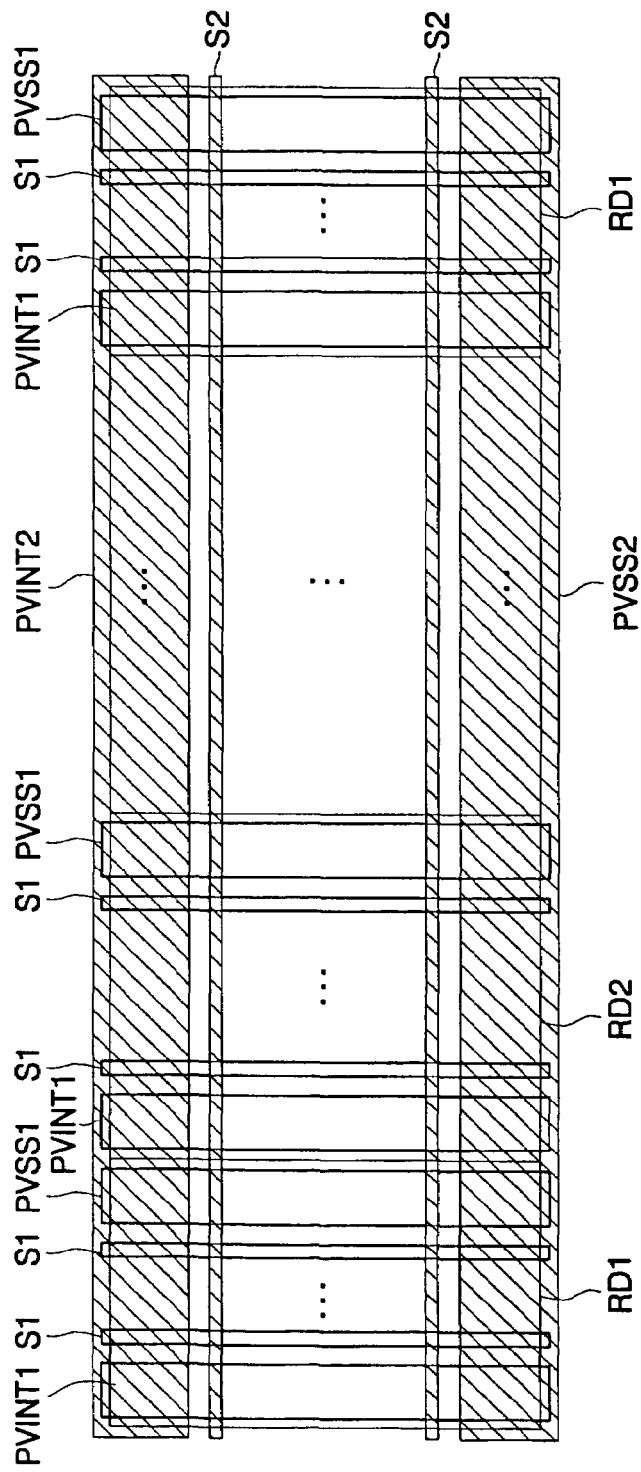
FIG. 5 also illustrates an enlarged view of a portion of the FIG. 1 row decoder, this time with particular attention to the signal and power trace routing layout for the two metal layers overlying the row decoder.
Figure 6:
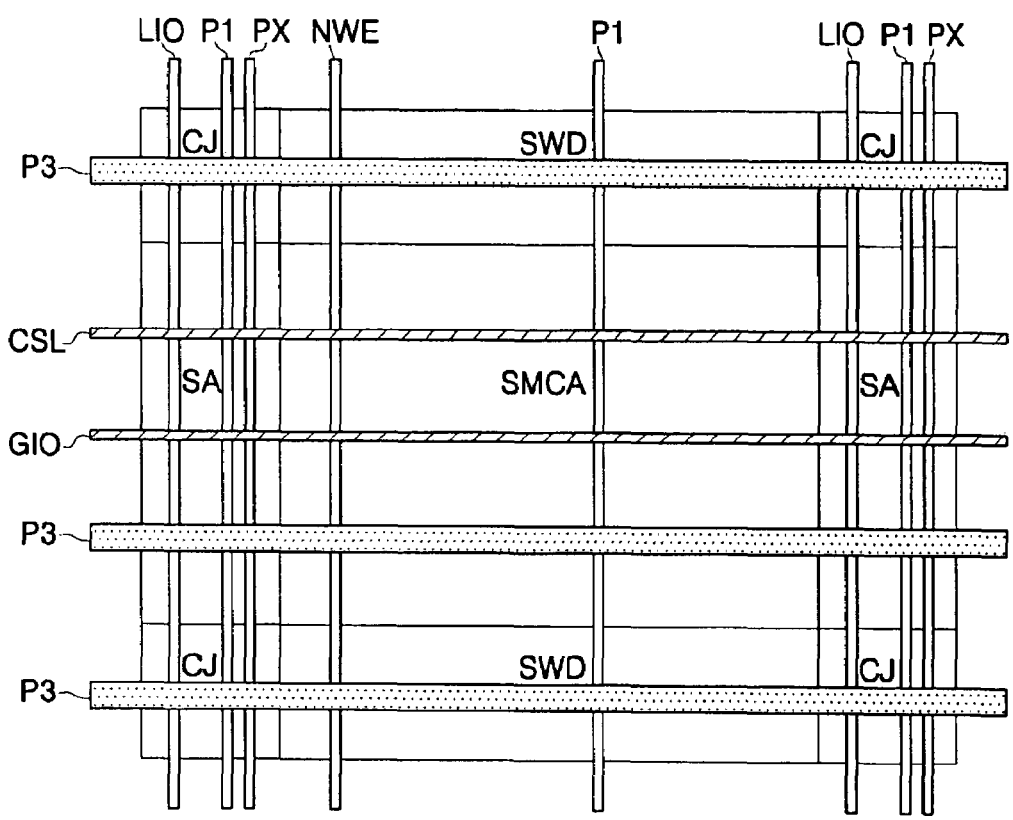
FIGS. 6–10 illustrate several embodiments showing triple-metal-layer signal and power line routing over a memory array.

FIG. 6 illustrates a first embodiment with signal and power lines routed over a memory array using three layers of metal. The first metal layer contains NWE, PX, LIO signal lines and P1 power lines, similar to the prior art. The second metal layer contains CSL and GIO signal lines, and no power lines. The third metal layer contains power lines P3 perpendicular to the P1 power lines formed with the first metal layer. The P3 power lines can be made wider than the prior art P2 power lines formed with the second metal layer because the CSL and GIO lines do not compete for the metal 3 area overlying the memory array. Although for purposes of clarity the feature is not illustrated in FIG. 6, portions of the P3 lines can even directly overlie CSL and GIO lines. Connections to power lines P1 exist in clearances where a P3 line overlies a P1 line of the same voltage, and may use a via contact (direct connection between the third metal and the first metal) or intermediate P2 pad (not shown) to connect to metal 1. The P3 lines thus can be routed with reduced resistance and improved power distribution. Spacing between CSL and GIO lines can also be improved due to the lack of P2 traces, reducing crosstalk and improving signal propagation speed.

Figure 7:
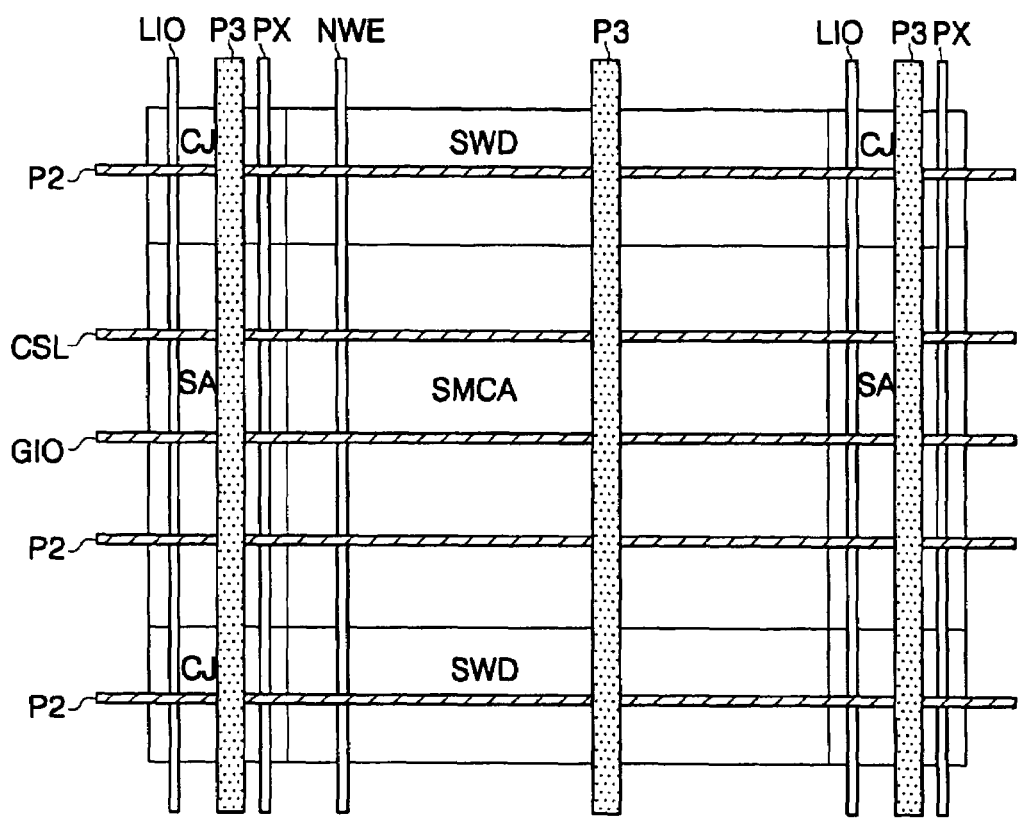

FIG. 7 illustrates a second embodiment with signal and power lines routed over a memory array using three layers of metal. In this embodiment, P1 lines do not exist on metal 1, and P2 lines parallel to CSL and GIO on metal 2 distribute power to the memory array circuitry. P3 lines are arranged on metal 3, perpendicular to the P2 lines and connecting to the P2 lines where a P3 line and a P2 line of the same voltage level cross. The P2 lines can remain relatively thin, while the P3 lines can be made relatively wide to efficiently carry current to the vicinity where it will be needed.

Figure 8:
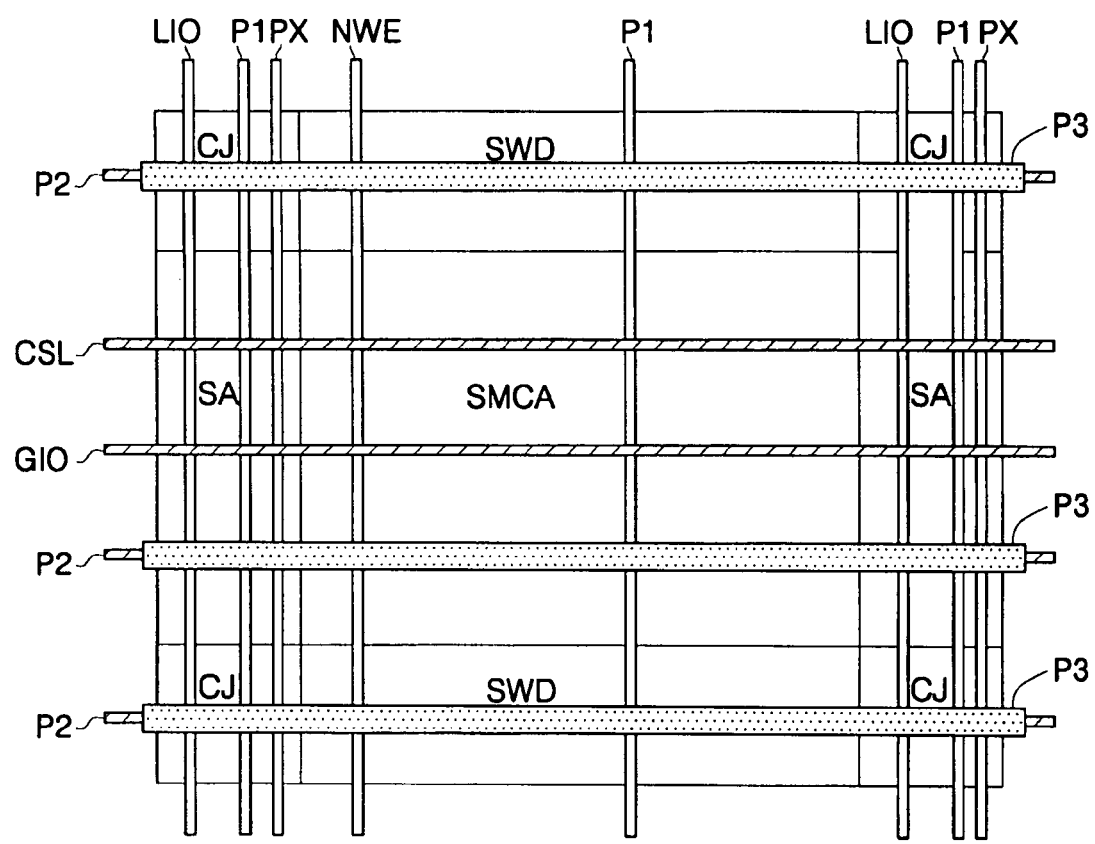

FIG. 8 illustrates a third embodiment with signal and power lines routed over a memory array using three layers of metal. In this embodiment, thin P1 power lines are crossed by thin P2 power lines. P1 and P2 lines of the same voltage level connect where they cross. Wider P3 power lines are routed parallel to the P2 lines, and generally overlap the P2 lines of the same voltage level. As the P3 and P2 lines overlap along their length, connection between the two lines can be made in long channels or in more frequent, abbreviated vias. The P3/P2 structures have lower resistance per unit length while occupying far less space on the metal layer shared with CSL and GIO.

Figure 9:
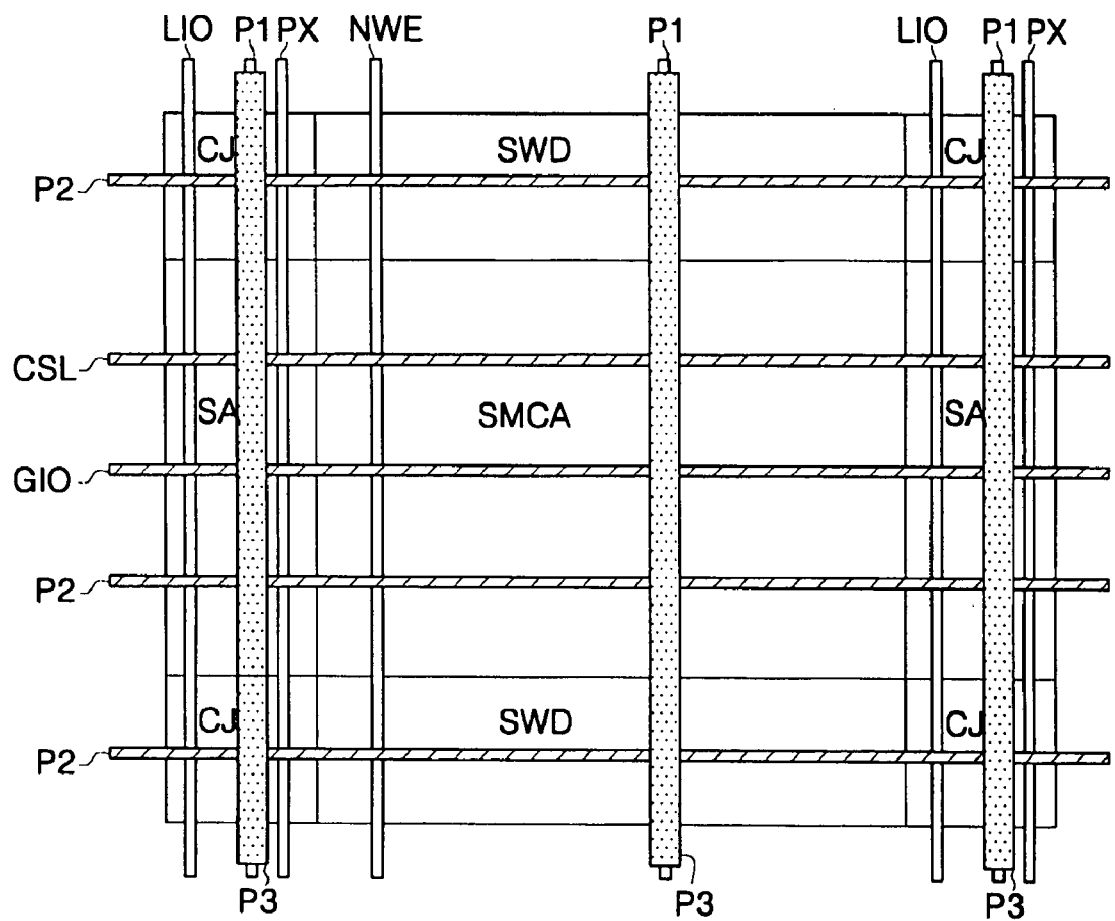

FIG. 9 illustrates a fourth embodiment with signal and power lines routed over a memory array using three layers of metal. In this embodiment, metal 1 contains thin P1 power lines routed parallel to NWE lines. Metal 2 contains thin P2 power lines routed perpendicular to the P1 power lines and parallel to CSL and GIO lines. Where a P2 power line crosses a P1 power line of the same voltage level, the two power lines connect. Metal 3 contains relatively wide P3 power lines parallel to the P1 power lines, and preferably routed so as to overlap an underlying P1 line of the same voltage level. Where a P3 power line crosses a P2 power line of the same voltage level, the two power lines connect.

Figure 10:
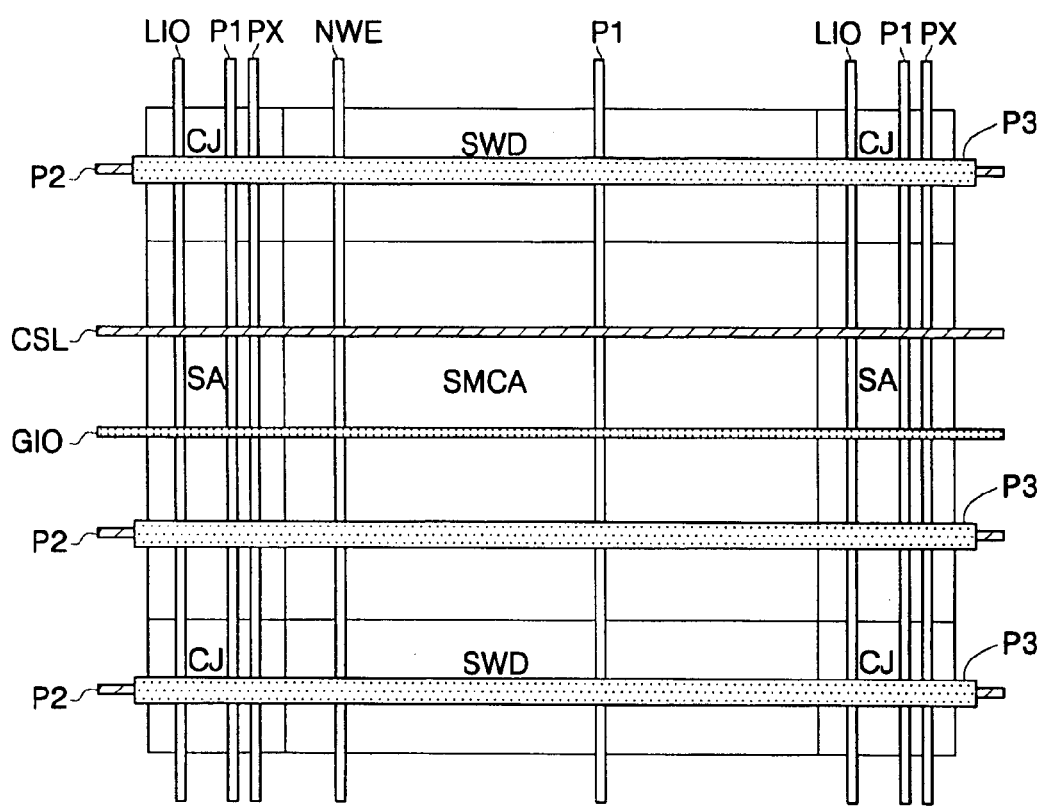

FIG. 10 illustrates a fifth embodiment with signal and power lines routed over a memory array using three layers of metal. This embodiment is similar to the third embodiment (FIG. 8), but the GIO lines are routed on metal 3 instead of metal 2. This can be an attractive alternate, since overlapping P2 and P3 lines can function together as a single conductor with reduced resistance, allowing P3 to be less wide and leaving room for signal lines on metal 3. Therefore, the line pitch between CSLs may be larger so that coupling noise can be reduced.

Figure 11:
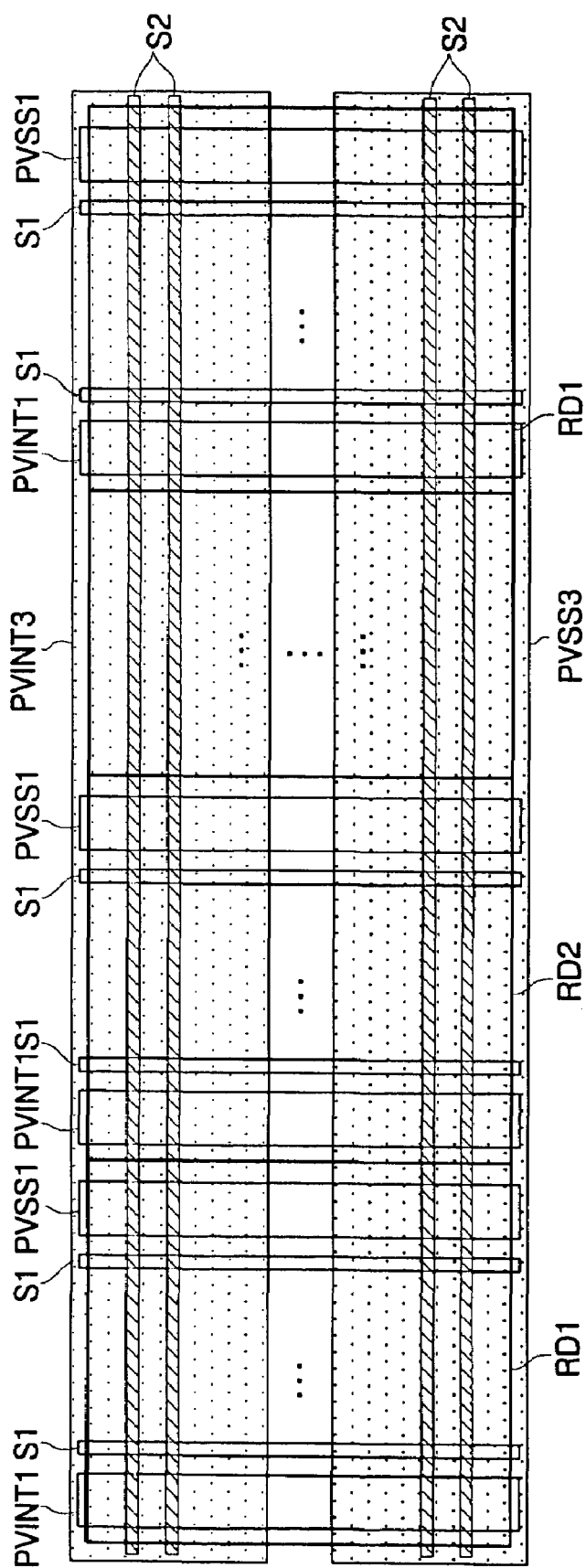
FIG. 11–14 illustrate several embodiments showing triple-metal-layer signal and power line routing over a row decoder.

Preferably, but not necessarily, in conjunction with one of the previous embodiments, various embodiments are also provided for routing signal and power lines overlying a row decoder. FIG. 11 illustrates a first row decoder embodiment. Relatively thin power lines PVINT1, PVSS1 are provided on a first metal layer to provide power to underlying row decoder circuitry. For instance, PVINT1 and PVSS1 power lines are arranged running from top to bottom towards an outboard area of row decoder area RD1, leaving an interior section overlying RD1 for running signal lines S1 in first metal. Other row decoder signal lines S2 are formed on second metal, running perpendicular to the PVINT1, PVSS1, and S1 lines. On third metal, relatively wide power lines PVINT3 and PVSS3 run parallel to the S2 lines, with each of PVINT3 and PVSS3 overlapping one or more of the signal lines S2. Where PVINT3 overlaps PVINT1 but not S2, a connection is made between the two power lines. Similarly, where PVSS3 overlaps PVSS1 but not S2, a connection is made between the two power lines. The connection may involve a via partially filled with metal 2, but no continuous metal 2 power lines exist in the embodiment. The connection may be made directly between metal 3 and metal 1 (via a contact). Advantageously, this arrangement allows extra room on metal 2 to spread or increase the number of lines S2, and also provides for power distribution through metal 3 power lines with a much larger cross-section than the prior art metal 2 power lines.

Figure 12:
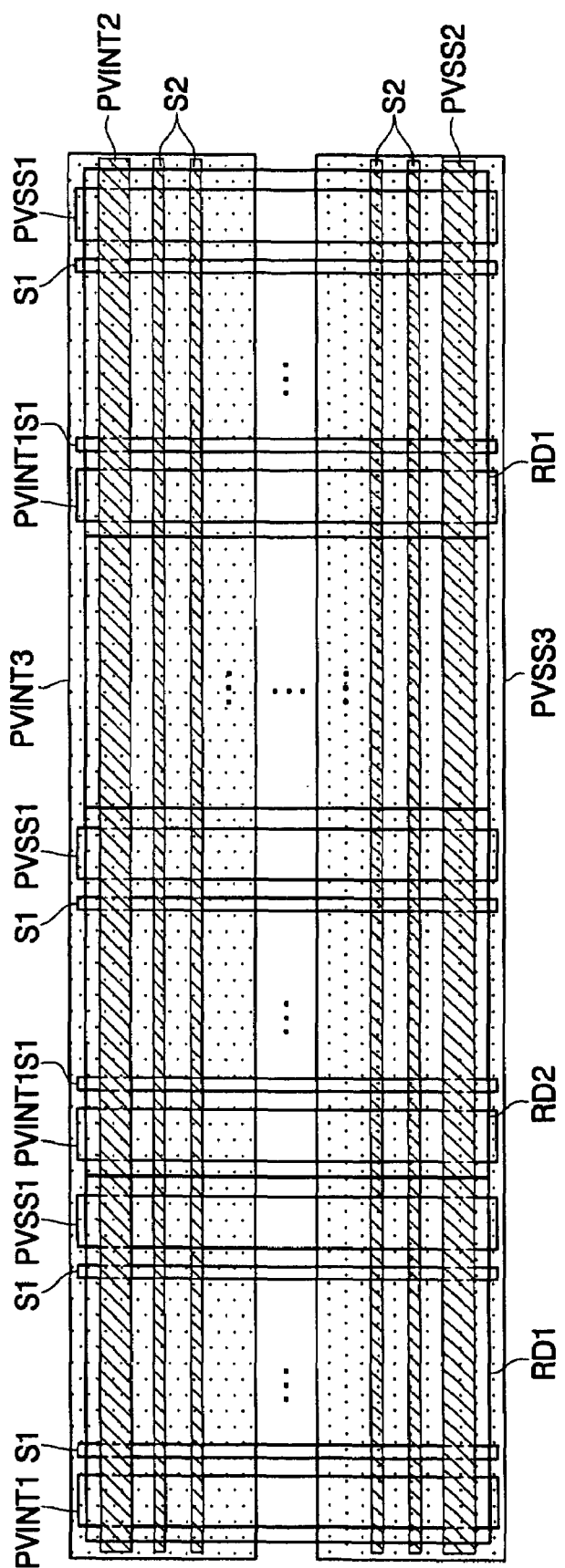

FIG. 12 illustrates a second row decoder embodiment similar to FIG. 11, but employing additional power lines PVINT2 and PVSS2 on metal 2 running parallel to and outboard of signal lines S2. Where PVINT2 overlaps PVINT1, a connection is made between the two power lines, and similar connections are made between PVSS2 and PVSS1. PVINT3 overlaps PVINT2 (and can also overlap one or more signal lines S2), with connection made between PVINT3 and PVINT2 where the two lines overlap. This connection can be an elongated channel or a series of more abbreviated vias spaced along the length of PVINT3 and PVINT2. A similar arrangement and connection exists between PVSS3 and PVSS2.

Figure 13:
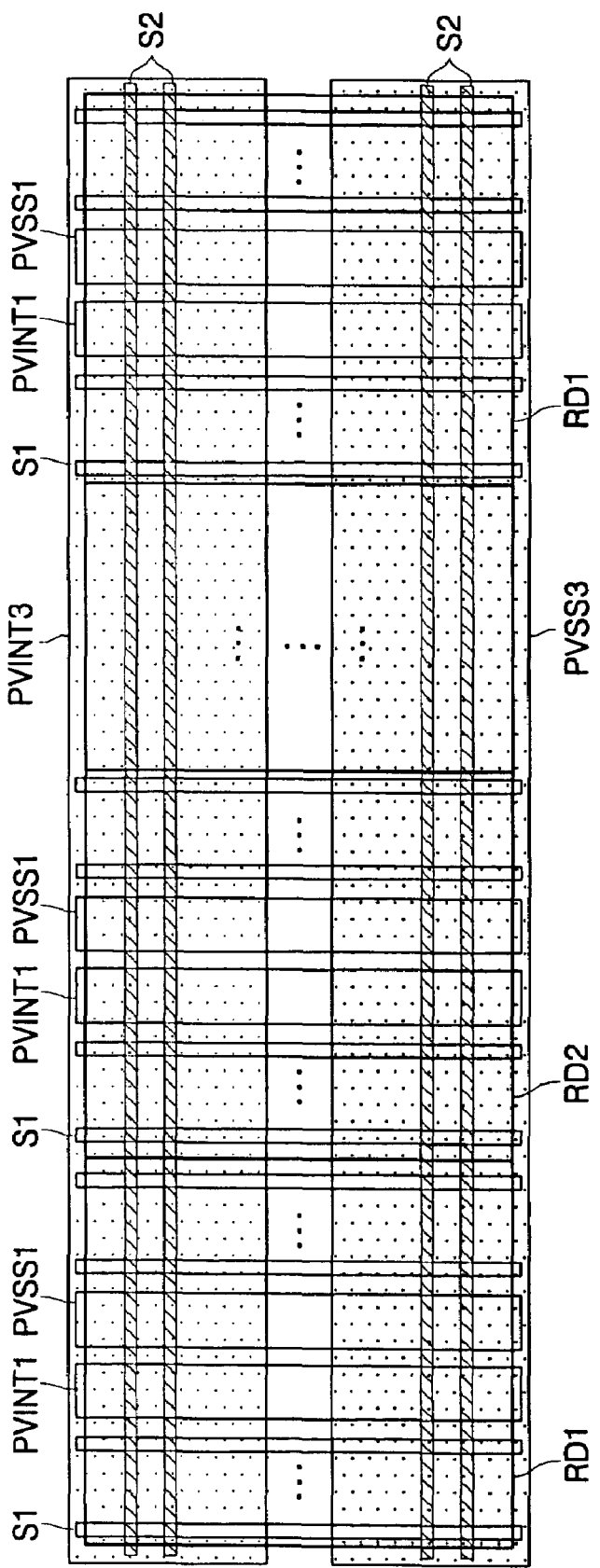

FIG. 13 illustrates a third row decoder embodiment similar to FIG. 11. PVINT1 and PVSS1 are placed centrally, however, above row decoder area RD1, with signal lines S1 located outboard of PVINT1 and PVSS1. Herein, PVINT2 and PVSS2 do not exist on the second metal layer.

Figure 14:
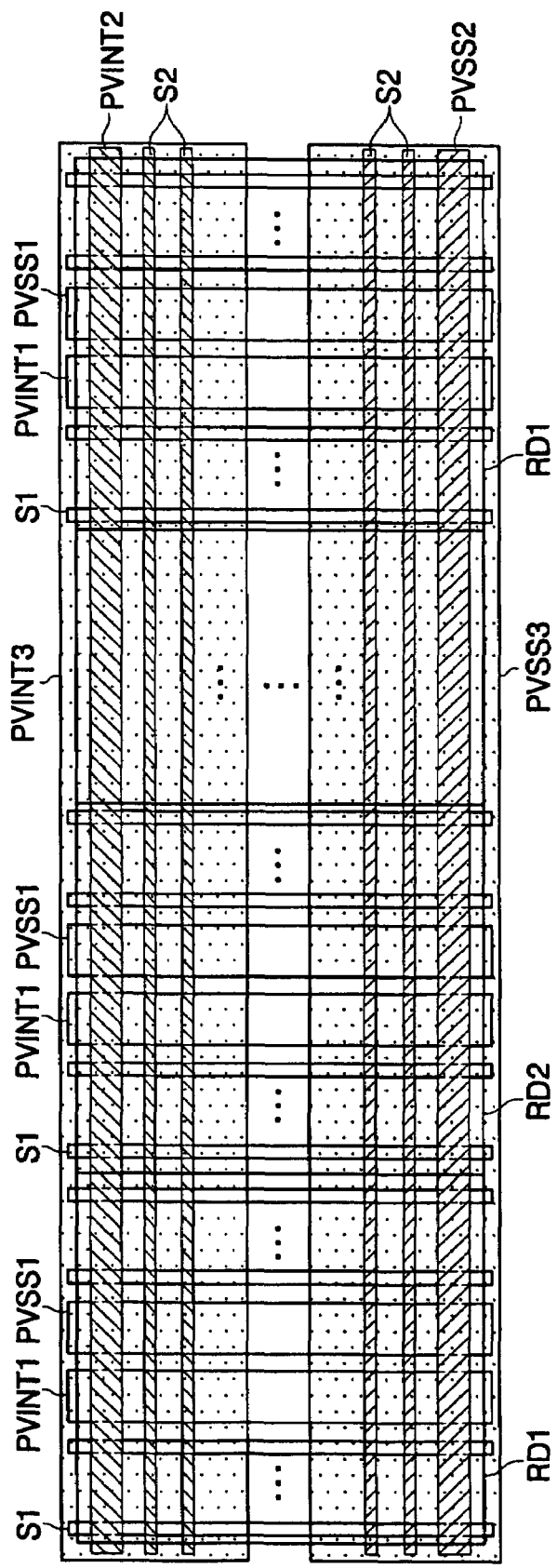

FIG. 14 illustrates a fourth row decoder embodiment similar to FIG. 12. PVINT1 and PVSS1 are placed centrally, however, above row decoder area RD1, with signal lines S1 located outboard of PVINT1 and PVSS1. Herein, PVINT2 and PVSS2 exist on the second metal layer with the signal line S2.

Figure 15:
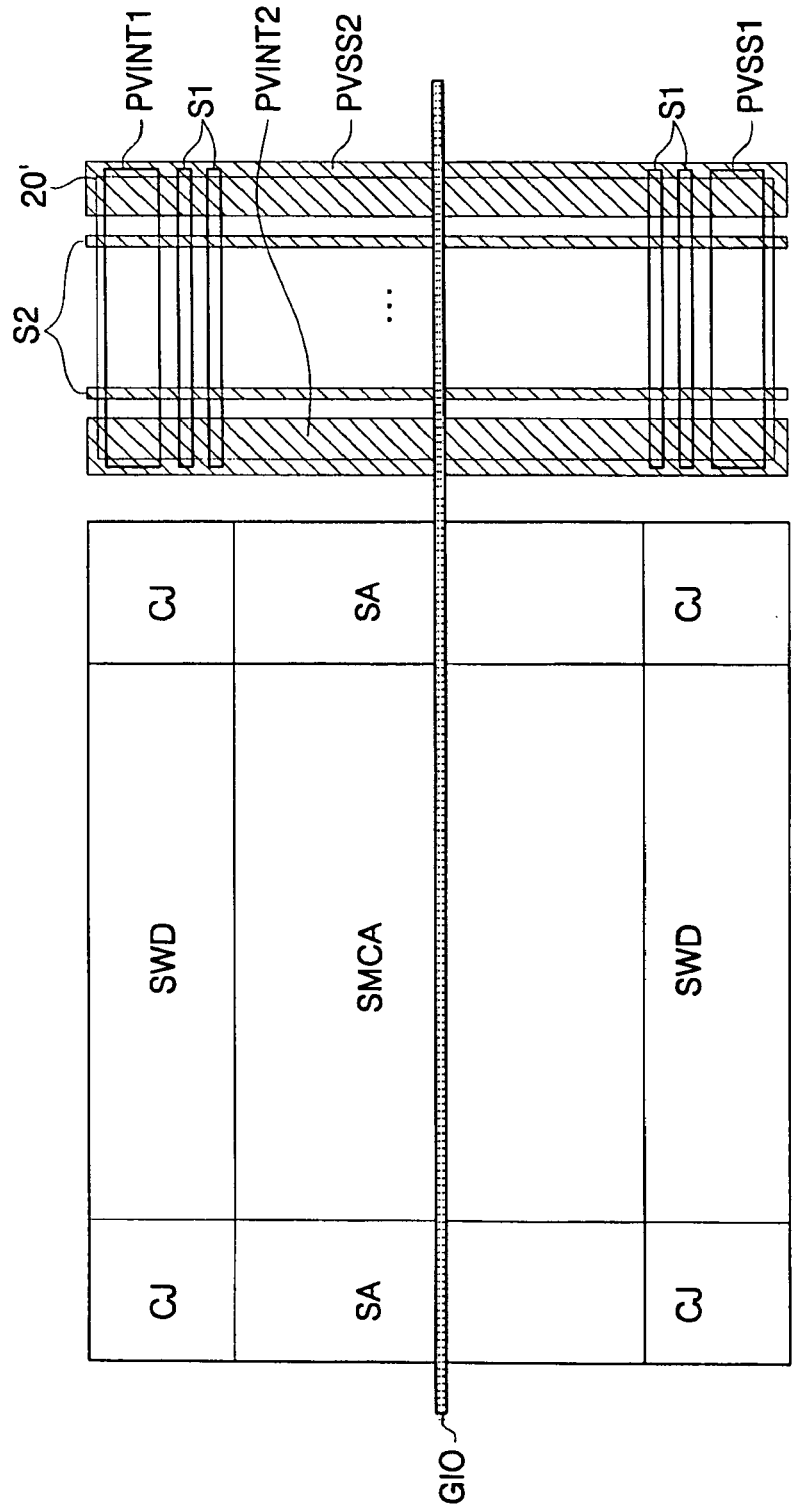
FIGS. 15 and 16 illustrate several embodiments showing triple-metal-layer signal and power line routing over a column decoder.

Preferably, but not necessarily, in conjunction with one of the previous embodiments, various embodiments are also provided for routing signal and power lines overlying a column decoder. FIG. 15 illustrates a first column decoder embodiment useful, for instance, with the embodiment of FIG. 10 having GIO lines placed on metal 3. A column decoder 20' uses signal lines S1 and power lines PVINT1 and PVSS1 located on metal 1, and signal lines S2 and power lines PVINT2 and PVSS2 located on metal 2 over the metal 1. On metal 3, however, the metal 3 GIO lines (and optionally metal 3 power lines, not shown, to supply power to the memory array) overlying the memory array continue directly over the column decoder toward a peripheral I/O circuit (not shown).

Figure 16:
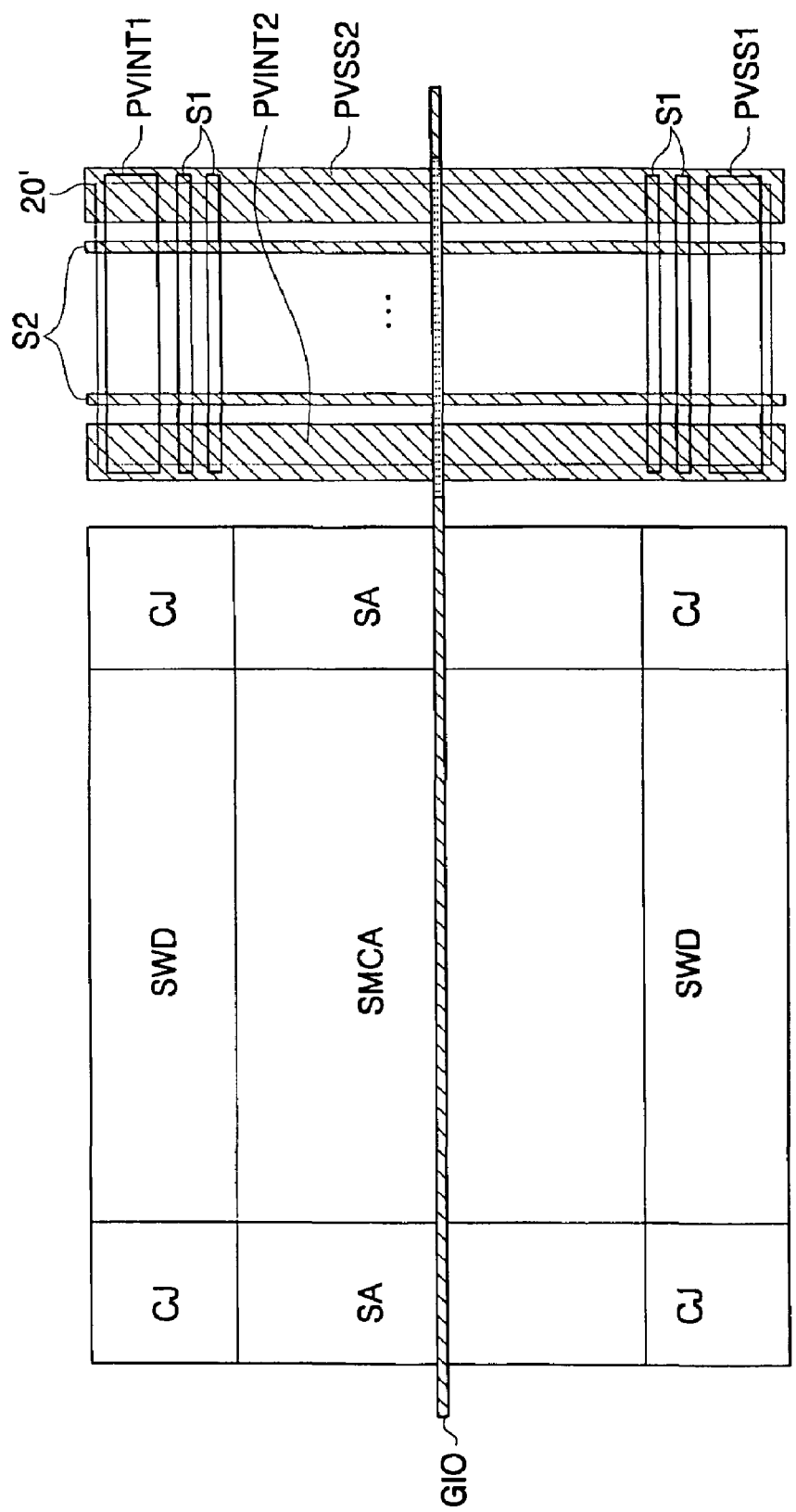

FIG. 16 illustrates a second column decoder embodiment similar to FIG. 15, where GIO lines route over the column decoder on metal 3. Just past the column decoder, however, each GIO line connects through a via to a GIO line continuing over the memory array on metal 2, e.g., as depicted in FIGS. 6–9.

Those skilled in the art will recognize that many other routing permutations can be envisioned that fall within the general framework of the described embodiments. Absolute line widths and spacings have not been discussed, as these are generally a function of device and process requirement. Such minor modifications and implementation details are encompassed within the embodiments of the invention, and are intended to fall within the scope of the claims.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A semiconductor dynamic random access memory (DRAM) device comprising:
    a memory cell array comprising a repeated row/column pattern of cell blocks, each cell block comprising a sub-memory-cell array, and a sense amplifier section and a sub-wordline driver section associated with the sub-memory-cell array;
    first, second, and third patterned metal layers disposed over the memory cell array, each patterned metal layer comprising a plurality of traces; and
    insulating layers deposited around the patterned metal layers to substantially insulate the traces except where holes in one of the insulating layers are provided to establish electrical contact to a trace;
    wherein the first patterned metal layer traces include
        a plurality of substantially parallel local Input/Output (I/O) lines, each coupled to a plurality of sense amplifier sections in cell blocks arranged in a row,
        a plurality of first power lines to provide memory cell array power, running substantially parallel to the local I/O lines, and
        a plurality of main word lines running substantially parallel to the local I/O lines, each connecting to a plurality of the sub-wordline driver sections in cell blocks arranged in a row;

wherein the second patterned metal layer traces include a plurality of substantially parallel column select lines, each connecting to an input/output gate in a cell block;

wherein the third patterned metal layer traces include a plurality of third power lines to provide memory cell array power; and wherein the traces in at least one of the second and third patterned metal layers further include a plurality of global I/O lines, running substantially parallel to the column select lines, each global I/O line connected to a plurality of the cell blocks to selectively multiplex a plurality of the local I/O lines onto that global I/O line.

2. The semiconductor DRAM device of claim 1, wherein the third power lines run substantially parallel to the column select lines.

3. The semiconductor DRAM device of claim 2, wherein the second patterned metal layer traces further include a plurality of second power lines to provide memory cell array power, the second power lines running substantially parallel to the column select lines.

4. The semiconductor DRAM device of claim 3, wherein each third power line substantially overlies a corresponding one of the second power lines and connects thereto.

5. The semiconductor DRAM device of claim 4, wherein each third power line has a width substantially larger than the width of the underlying second power line.

6. The semiconductor DRAM device of claim 4, wherein all of the global I/O lines exist on the third patterned metal layer.

7. The semiconductor DRAM device of claim 1, wherein the third power lines run substantially perpendicular to the column select lines.

8. The semiconductor DRAM device of claim 7, wherein the second patterned metal layer traces further include a plurality of second power lines to provide memory cell array power, the second power lines running substantially parallel to the column select lines.

9. The semiconductor DRAM device of claim 8, wherein at least one of the third power lines connects to at least one of the second power lines at a crossing between the third power line and an underlying second power line.

10. The semiconductor DRAM device of claim 7, wherein at least one of the third power lines substantially overlies a corresponding one of the first power lines and connects thereto.

11. The semiconductor DRAM device of claim 10, wherein the at least one of the third power lines has a width substantially larger than the width of the underlying first power line.

12. The semiconductor DRAM device of claim 1, further comprising a column decoder located at the periphery of the memory cell array and connected to at least some of the column select lines, wherein at least some of the global I/O lines cross the column decoder and are routed on third patterned metal layer traces at least where they cross the column decoder.

13. The semiconductor DRAM device of claim 12, wherein the at least some of the global I/O lines are routed on third patterned metal layer traces where they cross the memory array.

14. The semiconductor DRAM device of claim 12, wherein the at least some of the global I/O lines are routed on second patterned metal layer traces where they cross the memory array.

15. The semiconductor DRAM device of claim 1, wherein all of the global I/O lines exist on the second patterned metal layer.

16. The semiconductor DRAM device of claim 15, wherein the second patterned metal layer traces further comprise a plurality of second power lines to provide memory cell array power, the plurality of second power lines running substantially parallel to the column select lines.

17. The semiconductor DRAM device of claim 16, wherein the plurality of third power lines runs substantially perpendicular to the column select lines.

18. The semiconductor DRAM device of claim 17, wherein at least one of the third power lines substantially overlies a corresponding one of the first power lines and connects thereto.

19. The semiconductor DRAM device of claim 18, wherein the connection between the at least one of the third power lines substantially overlying a corresponding one of the first power lines exists in a via that allows the at least one third power line to directly contact the corresponding one of the first power lines.

20. A semiconductor dynamic random access memory (DRAM) device comprising:

a memory cell array comprising a repeated row/column pattern of cell blocks, each cell block comprising a sub-memory-cell array, and a sense amplifier section and a sub-wordline driver section associated with the sub-memory-cell array;

first, second, and third patterned metal layers disposed over the memory cell array, each patterned metal layer comprising a plurality of traces; and insulating layers deposited around the patterned metal layers to substantially insulate the traces except where holes in one of the insulating layers are provided to establish electrical contact to a trace;

wherein the first patterned metal layer traces include
a plurality of substantially parallel local Input/Output (I/O) lines, each coupled to a plurality of sense amplifier sections in cell blocks arranged in a row, and
a plurality of main word lines running substantially parallel to the local I/O lines, each connecting to a plurality of the sub-wordline driver sections in cell blocks arranged in a row;

wherein the second patterned metal layer traces include
a plurality of substantially parallel column select lines, each connecting to an input/output gate arranged in a cell block,
a plurality of second power lines to provide memory cell array power, the second power lines running substantially parallel to the column select lines, and
a plurality of global I/O lines, running substantially parallel to the column select lines, each global I/O line connected to a plurality of the cell blocks to selectively multiplex a plurality of the local I/O lines onto that global I/O line; and wherein the third patterned metal layer traces include a plurality of third power lines to provide memory cell array power.

21. The semiconductor DRAM device of claim 20, wherein the third power lines run substantially parallel to the column select lines.

22. The semiconductor DRAM device of claim 21, wherein each third power line substantially overlies a corresponding one of the second power lines and connects thereto.

23. The semiconductor DRAM device of claim 22, wherein each third power line has a width substantially larger than the width of the underlying second power line.

24. The semiconductor DRAM device of claim 20, wherein the first patterned metal layer traces further comprise a plurality of first power lines to provide memory cell array power.

25. The semiconductor DRAM device of claim 1, wherein the third power lines run substantially perpendicular to the column select lines.

26. The semiconductor DRAM device of claim 25, wherein at least one of the third power lines substantially overlies a corresponding one of the first power lines and connects thereto.

27. A semiconductor dynamic random access memory (DRAM) device comprising:
a memory cell array comprising a repeated row/column pattern of cell blocks, each cell block comprising a sub-memory-cell array, and a sense amplifier section and a sub-wordline driver section associated with the sub-memory-cell array;
first, second, and third patterned metal layers disposed over the memory cell array, each patterned metal layer comprising a plurality of traces; and
insulating layers deposited around the patterned metal layers to substantially insulate the traces except where holes in one of the insulating layers are provided to establish electrical contact to a trace;
wherein the first patterned metal layer traces include
a plurality of substantially parallel local Input/Output (I/O) lines, each coupled to a plurality of sense amplifier sections in cell blocks arranged in a row,
a plurality of first power lines to provide memory cell array power, running substantially parallel to the local I/O lines, and
a plurality of main word lines running substantially parallel to the local I/O lines, each connecting to a plurality of the sub-wordline driver sections in cell blocks arranged in a row;
wherein the second patterned metal layer traces include
a plurality of substantially parallel column select lines, each connecting to an input/output gate arranged in a cell block,
a plurality of second power lines to provide memory cell array power, the second power lines running substantially parallel to the column select lines, and
a plurality of global I/O lines, running substantially parallel to the column select lines, each global I/O line connected to a plurality of the cell blocks to selectively multiplex a plurality of the local I/O lines onto that global I/O line; and
wherein the third patterned metal layer traces include a plurality of third power lines to provide memory cell array power, each of the third power lines respectively overlying a corresponding one of the second power lines and having a trace width greater than the trace width of the underlying second power line.

28. A semiconductor dynamic random access memory (DRAM) device comprising:
a memory cell array comprising a repeated row/column pattern of cell blocks, each cell block comprising a sub-memory-cell array, and a sense amplifier section and a sub-wordline driver section associated with the sub-memory-cell array;
first, second, and third patterned metal layers disposed over the memory cell array, each patterned metal layer comprising a plurality of traces; and
insulating layers deposited around the patterned metal layers to substantially insulate the traces except where holes in one of the insulating layers are provided to establish electrical contact to a trace;
wherein the first patterned metal layer traces include
a plurality of substantially parallel local Input/Output (I/O) lines, each coupled to a plurality of sense amplifier sections in cell blocks arranged in a row,
a plurality of first power lines to provide memory cell array power, running substantially parallel to the local I/O lines, and
a plurality of main word lines running substantially parallel to the local I/O lines, each connecting to a plurality of the sub-wordline driver sections in cell blocks arranged in a row;
wherein the second patterned metal layer traces include a plurality of second power lines to provide memory cell array power; and
wherein the third patterned metal layer traces include
a plurality of substantially parallel column select lines, each connecting to a plurality of sense amplifier sections in cell blocks arranged in a column, and
a plurality of global I/O lines, running substantially parallel to the column select lines, each global I/O line connected to a plurality of the cell blocks to selectively multiplex a plurality of the local I/O lines onto that global I/O line.

29. A semiconductor DRAM device comprising:
a row decoder generating signals on a plurality of main word lines and comprising a plurality of control circuits;
first, second, and third patterned metal layers disposed over the row decoder, each patterned metal layer comprising a plurality of traces; and
insulating layers deposited around the patterned metal layers to substantially insulate the traces except where holes in the insulating layer are provided to establish electrical contact to a trace;
wherein the first patterned metal layer traces include
a plurality of first signal lines, each connecting to a predetermined one of the control circuits, and
a plurality of first power lines to provide power, running substantially parallel to the first signal lines;
wherein the second patterned metal layer traces include a plurality of substantially parallel second signal lines, arranged substantially perpendicular to the first signal lines; and
wherein the third patterned metal layer traces include a plurality of third power lines to provide power, the third power lines arranged substantially parallel to the second signal lines and substantially overlying at least some of the second signal lines.

30. The semiconductor DRAM device of claim 29, further comprising a memory cell array adjacent to the row decoder, wherein at least some of the first power lines provide power to the memory cell array.

31. The semiconductor DRAM device of claim 29, further comprising a memory cell array adjacent to the row decoder, wherein at least some of the third power lines provide power to the memory cell array.

32. The semiconductor DRAM device of claim 29, wherein the second patterned metal layer traces further include a plurality of second power lines to provide power, the second power lines running substantially parallel to the second signal lines, the second power lines each having a width substantially narrower than the width of the third power lines.

33. The semiconductor DRAM device of claim 32, wherein at least one of the third power lines substantially overlies at least one of the second power lines.

34. The semiconductor DRAM device of claim 32, wherein at least one of the first power lines runs across the central half of each of the control circuits.

35. The semiconductor DRAM device of claim 29, wherein at least one of the first power lines runs across the central half of each of the control circuits.

36. A semiconductor DRAM device comprising:
a row decoder comprising a row of decoder cells;
first, second, and third patterned metal layers disposed over the row decoder, each patterned metal layer comprising a plurality of traces; and
insulating layers deposited around the patterned metal layers to substantially insulate the traces except where holes in the insulating layer are provided to establish electrical contact to a trace;
wherein the first patterned metal layer traces include
a plurality of first signal lines, each connecting to a corresponding decoder cell, and
a plurality of first power lines to provide power, running substantially parallel to the first signal lines;
wherein the second patterned metal layer traces include
a plurality of substantially parallel second signal lines, arranged substantially perpendicular to the first signal lines, and
a plurality of second power lines to provide power, running substantially parallel to the second signal lines; and
wherein the third patterned metal layer traces include a plurality of third power lines to provide power, the third power lines arranged substantially parallel to the second signal lines and substantially overlying at least some of the second signal lines and second power lines.

37. The semiconductor DRAM device of claim 36, wherein, over each of the decoder cells, one of the first power lines provides an internal operating voltage and another of the first power lines provides a ground voltage.

38. The semiconductor DRAM device of claim 37, wherein over each of the decoder cells, the first power line providing the internal operating voltage and the first power line providing the ground voltage are arranged adjacent to each other, with at least one of the first signal lines lying over the decoder cell and outboard of the first power line providing the internal operating voltage, and with at least one other of the first signal lines lying over the decoder cell and outboard of the first power line providing the ground voltage.

39. The semiconductor DRAM device of claim 37, wherein over each of the decoder cells, at least two of the first signal lines lie adjacent to each other, the first power line providing the internal operating voltage outboard of those signal lines on one side and the first power line providing the ground voltage outboard of those signal lines on the other side.

40. A semiconductor DRAM device comprising:
a memory cell array;
a column decoder located at the periphery of the memory cell array;
first, second, and third patterned metal layers disposed over the column decoder, each patterned metal layer comprising a plurality of traces; and
insulating layers deposited around the patterned metal layers to substantially insulate the traces except where holes in one of the insulating layers are provided to establish electrical contact to a trace;
wherein the third patterned metal layer traces include a plurality of global I/O lines connected to the memory cell array.

41. The semiconductor DRAM device of claim 40, wherein the global I/O lines route over the memory cell array on second patterned metal layer traces connected respectively to the third patterned metal layer global I/O lines over the column decoder.

42. The semiconductor DRAM device of claim 40, wherein the third patterned metal layer global I/O lines route over the memory cell array as third patterned metal layer traces.

43. A method of routing power and signals overlying a DRAM array, the method comprising:
providing primary power traces on a third metal layer;
connecting the primary power traces to secondary power traces on at least one of a first metal layer and a second metal layer, the secondary power traces having a smaller trace width than the primary power traces; and
providing local I/O lines and word lines on the first metal layer.

44. The method of claim 43, further comprising providing column select lines on the second metal layer.

45. The method of claim 44, further comprising providing global I/O lines on the second metal layer.

46. The method of claim 44, further comprising providing global I/O lines on the third metal layer.

47. A method of routing power and signals overlying a DRAM row decoder, the method comprising:
providing primary power traces on a third metal layer;
connecting the primary power traces to secondary power traces on at least one of a first metal layer and a second metal layer, the secondary power traces having a smaller trace width than the primary power traces; and
providing signal lines on the first and second metal layers.

* * * * *

UNITED STATES PATENT AND TRADEMARK OFFICE
CERTIFICATE OF CORRECTION

| | | |
|---|---|---|
| PATENT NO. | : 7,161,823 B2 | Page 1 of 1 |
| APPLICATION NO. | : 11/134855 | |
| DATED | : January 9, 2007 | |
| INVENTOR(S) | : Jae-Young Lee et al. | |

It is certified that error appears in the above-identified patent and that said Letters Patent is hereby corrected as shown below:

Column 2, line 54, the word "PI" should read -- P1 --.

Signed and Sealed this

Twenty-first Day of October, 2008

JON W. DUDAS
*Director of the United States Patent and Trademark Office*